United States Patent [19]
Voorman

[11] Patent Number: 5,124,705
[45] Date of Patent: Jun. 23, 1992

[54] ANALOG-TO-DIGITAL SIGNAL CONVERTER COMPRISING A MULTIPLE SIGMA-DELTA MODULATOR

[75] Inventor: Johannes O. Voorman, Eindhoven, Netherlands

[73] Assignee: U.S. Philips Corporation, New York, N.Y.

[21] Appl. No.: 713,180

[22] Filed: Jun. 10, 1991

[30] Foreign Application Priority Data

Jun. 22, 1990 [NL] Netherlands ......................... 9001440

[51] Int. Cl.$^5$ ............................................. H03M 3/02
[52] U.S. Cl. ........................................ 341/143; 375/28
[58] Field of Search ............... 341/143, 122, 123, 144, 341/155, 158, 166, 167, 200; 375/27, 28, 33, 34; 364/724.04; 332/112

[56] References Cited

U.S. PATENT DOCUMENTS 4,862,169 8/1989 van Bavel ........................... 341/143
4,876,543 10/1989 van Bavel ........................... 341/143

*Primary Examiner*—A. D. Pellinen
*Assistant Examiner*—B. K. Young
*Attorney, Agent, or Firm*—Edward H. Goodman

[57] ABSTRACT

Analog-to-digital converter comprising a plurality of sigma-delta modulators, the input of the pulse shaper of a modulator always being coupled to the input of a next modulator via a coupling filter, and the output of the modulators being connected to the summing circuit via decimators, whereas in the decimators the filter function of the coupling filters is compensated. The loop filters in the modulators are described by third-order transfer functions with real poles and zeros.

14 Claims, 1 Drawing Sheet

ANALOG-TO-DIGITAL SIGNAL CONVERTER COMPRISING A MULTIPLE SIGMA-DELTA MODULATOR

BACKGROUND OF THE INVENTION

1. Field of the Invention

The invention relates to an analog-to-digital signal converter comprising two or more one-bit sigma-delta modulators, these modulators comprising each a closed loop arrangement of at least an adder, a low-pass filter and a pulse shaping circuit driven with a specific sampling frequency.

2. Description of the Related Art

A signal converter of this type is known from the article by Y. Matsuya et al. entitled: "A 16-bit Oversampling A-to-D Conversion Technology Using Triple-Integration Noise Shaping" published in IEEE Journal of the Solid-State Circuits, Vol. Sc-22, No. 6, Dec. 1987, pp. 921-929.

In the prior-art signal converter the noise shaping is realized by means of three sigma-delta modulators for working with a relatively low sampling frequency. In each of the sigma-delta modulators the selectiveness of the low-pass filter is determined by an integrator arranged as a first-order switched capacitor integrator. With the applied oversampling factor ($64\times$) a signal-to-noise ratio of about 50 dB (8 bits) is attained in the first sigma-delta modulator. The remaining noise is largely compensated for with the aid of the next sigma-delta modulators so as to attain, after addition in the decimators, a signal-to-noise ratio in excess of 90 dB. Therefore, the matching of the various branches is to be better than 1%.

The prior-art analog-to-digital converter is unsuitable for video applications which require signals having a large to a very large number of bits.

SUMMARY OF THE INVENTION

It is an object of the invention to provide an analog-to-digital converter suitable for video applications which require signals having a large to a very large number of bits.

This object is achieved in accordance with the invention by means of an analog-to-digital converter wherein the input of the pulse shaper of a first sigma-delta modulator is connected via a coupling filter to the input of the adder of a second sigma-delta modulator, and the outputs of these sigma-delta modulators are connected via decimators to a summing circuit, the filter function of the decimator at the output of the second sigma-delta modulator having the inverse value of the filter functions of the low-pass filters and the coupling filter. In this converter the difference (e) between the analog input signal (x) and the digital output signal (y) of the first sigma-delta modulator is applied to the second sigma-delta modulator, digitized there and subsequently added to the signal y in the summing circuit, so that the originally analog signal x is obtained in digital form approximately error-free.

The manner in which the sigma-delta modulators in the converter according to the invention are connected may be denoted as "nesting". For example, nesting is mentioned with respect to a signal quantization system not comprising sigma-delta modulators, described in U.S. Pat. No. 4,468,790. In that Patent a multilevel analog-to-digital converter is described, in which closed signal loops comprising a quantizer are interconnected without a coupling filter and of which the loop output signals are added each time by means of a summing circuit (the signal of the last loop via a quantizer).

A converter according to the invention provides the solution to the problem of enhanced noise in the circuits when higher frequencies are scaled to. The signal voltages in the circuits will have to be sufficiently high to exceed the noise by over 90 dB. Signal distortion will then begin to play an important role. In this situation it is better not to send the quantization noise (difference between input signal and output signal of the decision circuit) but the error signal (difference between input signal and output signal of the sigma-delta modulator) to the next sigma-delta modulator. In that case, not only the quantization noise but also the signal distortion is compensated.

The filtered error signal (which is available at the input of the decision circuit) is used to be transported to the next sigma-delta modulator.

The following conception has led to a further improvement of the converter. The spectrum of the error signal has an ascending nature (noise shaping) and the spectrum of the filtered error signal is substantially flat. The peak values of this signal will have to be processed undistorted by the next sigma-delta modulator i.e. be smaller than the fed back 1-bit signal. By including a low-pass filter between the sigma-delta modulators, the spectrum of the input signal of the next sigma-delta modulator is restricted so that the peak value of the signal to be processed in the next sigma-delta modulator is reduced considerably and this modulator is able to perform its function more accurately. The transfer function of this coupling filter is then corrected (for the signal band and slightly above this band) in the decimation filter, whereas this decimation filter obstructs the high-frequency portion of the signal. The third modulator in the proposed specifications may be omitted.

In the analog-to-digital converter according to the invention corrections are not only made for the inherent occurrence of quantization noise, but also for (minor) errors occurring in the input signal. The coupling filter between the first and second modulators prevents the second modulator from being overloaded by the noise at the input of the low-pass filter, which noise increases as the frequency increases.

An additional advantage of the converter according to the invention is that oscillations at a low signal level (in audio analog-to-digital converters known as "whistles") are reduced and shifted to higher frequencies (even to beyond the signal band).

It is possible to extend the converter into a configuration comprising three or even more modulators. An exemplary embodiment then comprises more than two sigma-delta modulators, while the input of the pulse shaper of a sigma-delta modulator, except for the last sigma-delta modulator, is always connected via a coupling filter to the input of the adder of a next sigma-delta modulator, and the outputs of all sigma-delta modulators are connected via decimators to a summing circuit and the filter function of each decimator, except for the decimator at the output of the first sigma-delta modulator, has the inverse value of the filter functions of the low-pass filters in and the coupling filters between the successive sigma-delta modulators up to the decimator.

Since a decimator circuit usually takes up rather much space (a ROM FIR filter approach additionally requires many transistors with all inherent problems of yield during manufacture), the decimators in a converter according to the invention preferably consist of a series-connection of one or a plurality of finite impulse response (FIR) filters, an equalizer and one or a plurality of halfband Nyquist filters.

The saving on space achieved with this preferred embodiment is even enhanced if the halfband Nyquist filters of the decimators are combined in a single circuit, and the summing circuit is inserted between the equalizers and this combined circuit.

In order to go from an input signal bandwidth of 24 kHz to approximately 5 MHz for enabling video signal processing with a similar accuracy of approximately 15 bits, the sampling frequency will have to be increased by a factor of 5 MHz/24 kHz, that is to say, by in excess of 200*3 MHz=600 MHz. The signal spectrums of the 1-bit signals extend to far beyond the sampling frequency. With these frequencies switched capacitor filters and also RC-active filters cannot be manufactured with accuracies of the order of 1%.

It has been experienced that a converter is specifically suitable for high frequencies if the low-pass filters included in the signal loop are described by third-order transfer functions with real poles and zeros.

By incorporating higher-order loop filters in the sigma-delta modulators, as far as stability permits, in the first modulator an improved signal-to-noise ratio can be achieved already with a lower sampling frequency, e.g. 62 dB (10 bits) at 400 MHz. The second modulator then needs to correct less so that also the requirements made on the matching become less strict by a factor of 4 (12 dB).

In a preferred embodiment for a very high frequency signal converter, the sigma-delta modulators each comprise an active filter having a passive RC impedance at its input and one at its output, and comprise a second closed loop in which the one-bit signal at the output of the converter is fed back to the output of the active filter. A sigma-delta modulator of this type is disclosed in parallel Dutch Patent Application No. PHN 13.371.

When applying this sigma-delta modulator to a single analog-to-digital converter, it is possible with the respective sampling frequencies of 216 MHz, 432 MHz, 864 MHz or 1728 MHz to produce a digital signal of 7.5, 10, 12.5 or 15 bits, respectively. With a sampling frequency of 432 MHz (10 bits) the extension according to the invention of the first sigma-delta modulator by a second sigma-delta modulator provides an additional 6-bit sensitivity, so that a 16-bit signal is produced as the output signal of the summing circuit.

In order to avoid signal crosstalk the signal in the pulse shaper is "blanked" in known fashion.

BRIEF DESCRIPTION OF THE INVENTION

The invention will be further explained hereinafter by means of the examplary embodiments referring to the drawing Figures, in which:

FIG. 1 shows a block diagram of a simple exemplary embodiment of an analog-to-digital converter comprising two sigma-delta modulators; and FIG. 2 shows a block diagram of a complete analog-to-digital converter having a multiple modulator configuration.

DESCRIPTION OF THE PREFERRED EMBODIMENT

Figure 1:
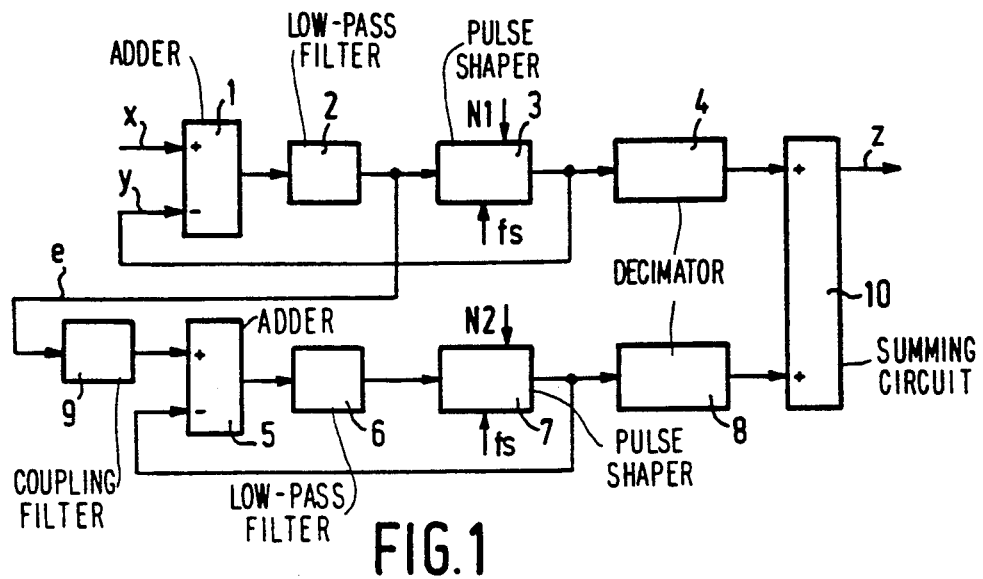

FIG. 1 shows a block diagram of an analog-to-digital converter comprising two sigma-delta modulators each consisting of an adder (1, 5), a low-pass filter (2, 6) and a pulse shaper (3, 7) driven with the sampling frequency fs. An analog signal x is applied to the adder (1) of the first modulator. Let y be the output signal of the first modulator, then an error signal $e = x - y$ can be defined. The error signal e is applied via a coupling filter (9) to the input of the adder (5) of the second modulator after it has passed through the low-pass filter (2). The output signals of the two modulators are applied each via a decimator (4, 8) to the input of a summing circuit (10), and added together to become the (digital) output signal, referenced z. The quantization noise introduced in the pulse shapers (3, 7) is represented by N1 and N2 respectively. The transfer function of the filter (2) in the first modulator, the coupling filter (9) and the filter (6) in the second modulator are defined as F1, G1 and F2 respectively. If in this example pulse shapers (3, 7) are modelled as a sampling circuit and a quantizer, respectively, whereas in this respect sampling denotes multiplication by a series of delta pulses and quantization denotes the addition of white noise, if the value of 1 is assigned to the transfer function of the first decimator (4) and if the second decimator (8) is 1 described by means of a transfer function $(1 + F2)/F^1$ which contains the inverse functions $(F^1 = F1.G1.F2)$ of the filters (2), (9) and (6), the output signal z will be produced by $z = x + N2/F^1 = x + N2/F1.G1.F2$. From the latter equation it follows that the difference between the digital output signal z and the analog input signal x is less by an order of magnitude than in a corresponding analog-to-digital converter comprising a single sigma-delta modulator.

Figure 2:
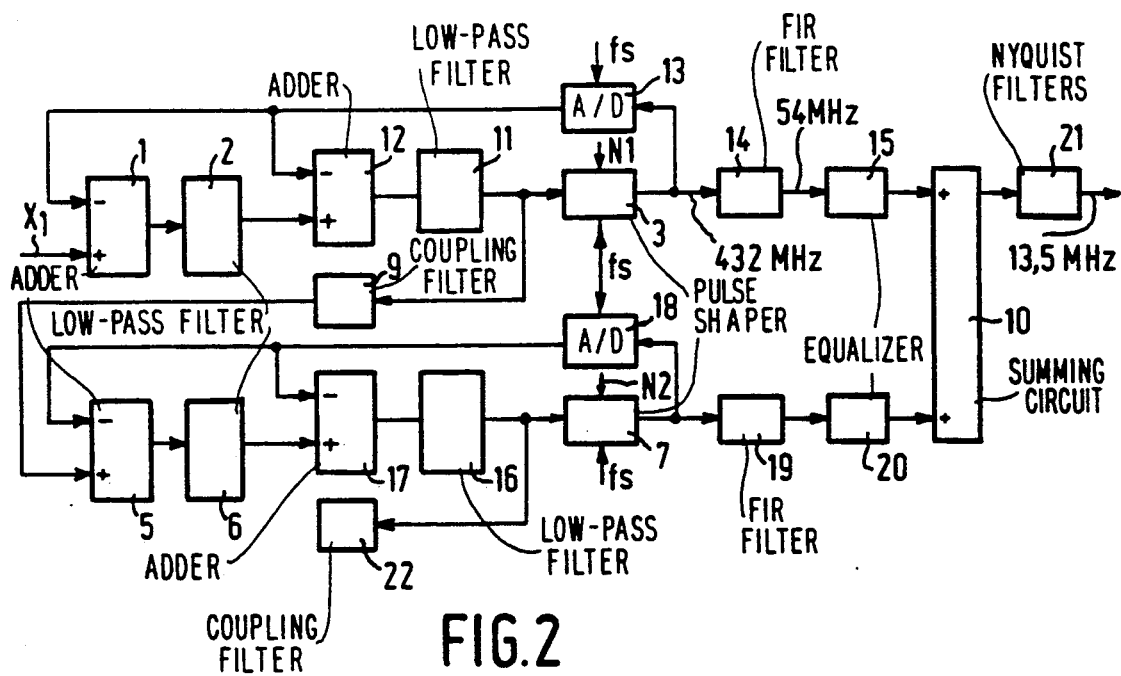

FIG. 2 shows a block diagram of a complete analog-to-digital converter in a multiple modulator configuration, comprising two sigma-delta modulators that consist each of a first adder (1, 5), a second adder (12, 17), a low-pass filter (2, 6), a second low-pass filter (11, 16), a pulse shaper (3, 7) driven with sampling frequency fs and an analog-to-digital converter (13, 18) respectively, likewise driven with fs. The error signal after the second adder (12) in the first modulator is applied to a first adder (5) of the second modulator via a coupling filter (9), after which this signal is likewise digitized. If so desired, the error signal developed during this second analog-to-digital conversion can be applied to a third similar sigma-delta modulator via a coupling filter (22).

The output signals of the first and second modulators are applied each through a FIR filter or a combination of FIR filters (14, 19) and an equalizer (15, 20) to a summing circuit (10) where the signals are combined into the digital output signal. The halfband Nyquist filters (21) are combined in this example into a single circuit for the two sigma-delta modulators and connected downstream of the summing circuit (10). The output signal (z) is available at the output of the halfband filter (21). The quantization noise generated in the pulse shapers (3, 7) is represented by N1 and N2 respectively. The pulse shapers (3, 7) in this example are driven with a sampling frequency of 432 MHz. Decimation to 54 MHz takes place in the FIR filters (14 and 19) and to 13.5 MHz in the halfband Nyquist filters (21).

If in this example the pulse shapers (3, 7) are modelled as a sampling circuit and a quantizer, the sampling denoting multiplication by a series of delta pulses and quantization denoting the addition of white noise, the transfer functions of the filters (2), (11) and (16) and of the filters (6), (16) and (22) being given by F1, F2 and F3, respectively, and the function of the combination of the FIR filters (19) and equalizer (20) in the last sigma-delta modulator having the inverse value of the low-pass filters (11, 2, 16 and 6) and the coupling filter (9), an analysis of this circuit will show that the output signal z is produced by $z = x1 + N2/(F1^2 \cdot F2^2 \cdot F3)$, from which it may be concluded that the noise shaping in this converter has the same order of magnitude as in a converter comprising a higher order filter.

I claim:

1. Analog-to-digital signal converter comprising two or more one-bit sigma-delta modulators, these modulators each comprising a closed loop arrangement of at least an adder, a low-pass filter and a pulse shaping circuit driven with a specific sampling frequency, characterized in that the input of the pulse shaper of a first of said sigma-delta modulators is connected via a coupling filter to the input of the adder of a second of said sigma-delta modulators, and the outputs of these sigma-delta modulators are connected via decimators to a summing circuit, the filter function of the decimator at the output of the second sigma-delta modulator having the inverse value of the filter functions of the low-pass filters and the coupling filter.

2. Analog-to-digital signal converter as claimed in claim 1, characterized in that it comprises more than two sigma-delta modulators, while the input of the pulse shaper of a sigma-delta modulator, except for the last sigma-delta modulator, is always connected via a coupling filter to the input of the adder of a next sigma-delta modulator, and the outputs of all sigma-delta modulators are connected via decimators to a summing circuit and the filter function of each decimator, except for the decimator at the output of the first sigma-delta modulator, has the inverse value of the filter functions of the low-pass filters in and the coupling filters between the successive sigma-delta modulators up to the decimator.

3. Analog-to-digital signal converter as claimed in claim 1, characterized in that the decimators consist of a series-connection of one or a plurality of finite impulse response (FIR) filters, an equalizer and one or a plurality of halfband Nyquist filters.

4. Analog-to-digital signal converter as claimed in claim 3, characterized in that the halfband Nyquist filters of the decimators are combined in a single circuit, and the summing circuit is inserted between the equalizers and this combined circuit.

5. Analog-to-digital signal converter as claimed in claims 1, characterized in that the low-pass filters included in the signal loop are described by third-order transfer functions with real poles and zeros.

6. Signal converter as claimed in one of the claims 1 to 5, characterized in that the sigma-delta modulators comprise each an active filter having a passive RC impedance at its input and one at its output, and comprise also a second closed loop in which the one-bit signal at the output of the converter is fed back to the output of the active filter.

7. Analog-to-digital signal converter as claimed in claim 2, characterized in that the decimators consist of a series-connection of one or a plurality of finite impulse response (FIR) filters, an equalizer and one or a plurality of halfband Nyquist filters.

8. Analog-to-digital signal converter as claimed in claim 7, characterized in that the halfband Nyquist filters of the decimators are combined in a single circuit, and the summing circuit is inserted between the equalizers and this combined circuit.

9. Analog-to-digital signal converter as claimed in claim 2, characterized in that the low-pass filters included in the signal loop are described by third-order transfer functions with real poles and zeros.

10. Analog-to-digital signal converter as claimed in claim 3, characterized in that the low-pass filters included in the signal loop are described by third-order transfer functions with real poles and zeros.

11. Analog-to-digital signal converter as claimed in claim 4, characterized in that the low-pass filters included in the signal loop are described by third-order transfer functions with real poles and zeros.

12. Analog-to-digital signal converter as claimed in claim 7, characterized in that the low-pass filers included in the signal loop are described by third-order transfer functions with real poles and zeros.

13. Analog-to-digital signal converter as claimed in claim 8, characterized in that the low-pass filters included in the signal loop are described by third-order transfer functions with real poles and zeros.

14. Analog-to-digital signal converter comprising two or more one-bit sigma-delta modulators, these modulators including each a closed loop arrangement of at least an adder, a low-pass filter and a pulse shaper driven with a specific sampling frequency, characterized in that the sigma-delta modulators comprise each an active filter having a passive RC impedance at its input and one at its output, and comprise also a second closed loop in which the one-bit signal at the output of the converter is fed back to the output of the active filter.

* * * * *